(12) United States Patent
Evtyushkin et al.

(10) Patent No.: US 11,158,925 B2
(45) Date of Patent: Oct. 26, 2021

(54) SINGLE-POLE MULTI-THROW SWITCH DEVICE HAVING SIMPLE STRUCTURE

(71) Applicant: Samsung Electronics Co., Ltd., Gyeonggi-do (KR)

(72) Inventors: Gennadiy Alexandrovich Evtyushkin, Moscow (RU); Anton Sergeevich Lukyanov, Moscow (RU); Mikhail Nikolaevich Makurin, Domodedovo (RU); Artem Yurievich Nikishov, Kolomna (RU); Elena Aleksandrovna Shepeleva, Kostroma (RU)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 17/049,207

(22) PCT Filed: Sep. 20, 2019

(86) PCT No.: PCT/KR2019/012248
§ 371 (c)(1),
(2) Date: Oct. 20, 2020

(87) PCT Pub. No.: WO2020/060294
PCT Pub. Date: Mar. 26, 2020

(65) Prior Publication Data
US 2021/0242557 A1    Aug. 5, 2021

(30) Foreign Application Priority Data
Sep. 20, 2018    (RU) .......................... RU2018133358

(51) Int. Cl.
*H01P 5/12*    (2006.01)
*H01P 3/08*    (2006.01)
*H03K 17/51*    (2006.01)

(52) U.S. Cl.
CPC ................. *H01P 5/12* (2013.01); *H01P 3/081* (2013.01); *H03K 17/51* (2013.01)

(58) Field of Classification Search
CPC ............ H01P 5/12; H01P 3/081; H03K 17/51
(Continued)

(56) References Cited

U.S. PATENT DOCUMENTS 3,678,414 A    7/1972    Hallford
4,313,065 A    1/1982    Yoshida et al.
(Continued)

FOREIGN PATENT DOCUMENTS

EP    722221    7/1996
EP    1 515 390    3/2005
(Continued)

OTHER PUBLICATIONS

International Search Report dated Jan. 3, 2020 issued in counterpart application No. PCT/KR2019/012248, 14 pages.
(Continued)

*Primary Examiner* — Tomi Skibinski
(74) *Attorney, Agent, or Firm* — The Farrell Law Firm, P.C.

(57) ABSTRACT

A switch device is disclosed. The switch device includes: an input point; a first output point; a second output point; a first transmission line connecting the input point to the first output point; a second transmission line connecting the input point to the second output point; a switch unit connected to the first output point; and a third transmission line of which one end is connected to the switch unit and the other end is connected to the second output point, wherein the third transmission line causes a 90-degree phase shift when a signal at an operating frequency is delivered therethrough, the switch unit is controlled to be in an ON or OFF state according to one control signal, opens or grounds each of the
(Continued)

first output point and the one end of the third transmission line.

15 Claims, 26 Drawing Sheets

(58) Field of Classification Search
USPC .......................................................... 327/574
See application file for complete search history.

(56) References Cited

U.S. PATENT DOCUMENTS

| | | | |
|---|---|---|---|
| 4,396,833 A | 8/1983 | Pan | |
| 5,461,684 A | 10/1995 | Vinchant et al. | |
| 5,519,364 A | 5/1996 | Kato et al. | |
| 6,313,803 B1 | 11/2001 | Manasson et al. | |
| 6,580,337 B1 | 6/2003 | Valas | |
| 6,667,670 B2* | 12/2003 | Hong | H01P 1/10 330/124 R |
| 7,009,195 B2 | 3/2006 | Nakano et al. | |
| 7,277,065 B2 | 10/2007 | Wu et al. | |
| 8,149,070 B2 | 4/2012 | Albag et al. | |
| 8,149,071 B2* | 4/2012 | Ryou | H01P 1/15 333/103 |
| 8,909,171 B2 | 12/2014 | Kim et al. | |
| 9,312,853 B2 | 4/2016 | Sigetani et al. | |
| 9,431,564 B2 | 8/2016 | Davies | |
| 9,496,610 B2 | 11/2016 | Blech | |
| 9,736,911 B2 | 8/2017 | Taipale et al. | |

FOREIGN PATENT DOCUMENTS

| | | |
|---|---|---|
| EP | 02887456 | 6/2015 |
| FR | 2841708 | 7/2005 |
| JP | 11-186803 | 7/1999 |
| JP | 2004-229208 | 8/2004 |
| JP | 4641491 | 3/2011 |
| KR | 10-0403972 | 11/2003 |
| SU | 1293836 | 2/1987 |

OTHER PUBLICATIONS

PCT/ISA/210 Search Report issued on PCT/KR2019/012248, dated Jan. 3, 2020, pp. 5.
PCT/ISA/237 Written Opinion issued on PCT/KR2019/012248, dated Jan. 3, 2020, pp. 3.
Russian NOA dated May 6, 2019 issued on counterpart application No. 2018133358, pp. 16.
Russian Search Report dated May 6, 2019 issued in counterpart application No. 2018133358, pp. 4.
Deborah M. Vechtel et al., "Radio frequency switching network: a technique for infrared sensing" Opt. Eng. 55(10), 107106 (2016), doi: 10.1117/1.OE55.10.107106, pp. 8.
Youssef Tawk et al., 2011 IEEE International Symposium on Antennas and Propagation. "Measuring the transition switcheing speed of a semiconductor-based photoconductive switch using RF techniques", pp. 4.
European Search Report dated Mar. 31, 2021 issued in counterpart application No. 19863609.4-1203, 8 pages.

* cited by examiner

SINGLE-POLE MULTI-THROW SWITCH DEVICE HAVING SIMPLE STRUCTURE

PRIORITY

This application is a National Phase Entry of PCT International Application No. PCT/KR2019/0122480 which was filed on Sep. 20, 2019, and claims priority to Russian Patent Application No. 2018133358, which was filed in Russia on Sep. 20, 2018, the content of each of which is incorporated herein by reference.

TECHNICAL FIELD

The present disclosure relates to a single-pole multi-throw, switch device having a simple structure.

BACKGROUND ART

A high frequency switch or a commutator is an important component in modern electronic devices, Because these devices have gradually become more complicated and operate at a very high frequency, there are many difficulties which cannot be solved by a switch element designed and operated based on the related art. Recently, a p-type intrinsic n-type (PIN) diode, a metal oxide semiconductor field-effect transistor (MOSFET), and a micro-electromechanical system (MEMS) are widely used as switching components of a high frequency circuit, but these components require a complex control circuit and are expensive, as the PIN diode requires a specific decoupling circuit, the MOSFET causes considerable circuit mismatch due to a high parasitic capacitance, and the MEMS involves a limited number of switching cycles and a high control voltage.

DESCRIPTION OF EMBODIMENTS

Technical Problem

An embodiment of the present disclosure provides a single-pole multi-throw switch device having a simple and efficient structure.

Solution to Problem

According to an embodiment of the present disclosure, there is provided a switch device including: an input point; a first output point; a second output point; a first transmission line connecting the input point to the first output point; a second transmission line connecting the input point to the second output point; a switch unit connected to the first output point; and a third transmission line of which one end is connected to the switch unit and the other end is connected to the second output point, wherein the third transmission line causes a 90-degree phase shift when a signal at an operating frequency is delivered therethrough, the switch unit is controlled to be in an ON or OFF state according to one control signal, opens each of the first output point and the one end of the third transmission line when in the OFF state, and grounds each of the first output point and the one end of the third transmission line when in the ON state.

A length of the third transmission line may be ¼ of an operating wavelength.

The third transmission line may include a reactance unit configured to cause the 90-degree phase shift when the signal of the operating frequency is delivered therethrough.

Each of the first transmission line and the second transmission line may cause the 90-degree phase shift when the signal of the operating frequency is delivered therethrough.

Impedances of the first transmission line and the second transmission line may be identical to each other and be two times an impedance of the third transmission line.

The switch unit may include: a ground point; a first switch element connecting the first output point to the ground point; and a second switch element connecting the ground point to the one end of the third transmission line, wherein the first switch element and the second switch element are simultaneously controlled to be in the ON or OFF state according to the one control signal.

The one control signal may be an optical signal.

The switch unit may include: a ground point; and a photoconductive element connecting the first output point, the ground point, and the one end of the third transmission line.

The third transmission line may be a planar transmission line, a width of the ground point may be greater than a width of the third transmission line, and a width of the one end of the third transmission line may extend to be the same as the width of the ground point.

The ground point may have a width greater than a length and be connected to a plurality of ground vias arranged in a widthwise direction.

The switch device may be implemented based on a coplanar waveguide (CPW), wherein the ground point is connected to a coplanar ground surface.

The switch device may be implemented based on a grounded coplanar waveguide (GCPW), wherein the ground point is connected to a coplanar ground surface, shielding vias are arranged around each of the first transmission line, the second transmission line, and the third transmission line, and the shielding vias connect the coplanar ground surface to a lower ground surface.

The switch device may further include: a third output point; a fourth transmission line connecting the input point to the third output point; a second switch unit connected to the second output point; and a fifth transmission line of which one end is connected to the second switch unit and the other end is connected to the third output point, wherein the fifth transmission line causes the 90-degree phase shift when the signal of the operating frequency is delivered therethrough, and the second switch unit is controlled to be in the ON or OFF state according to one control signal, opens each of the second output point and the fifth transmission line when in the OFF state, and grounds each of the second output point and the fifth transmission line when in the ON state.

According to another embodiment of the present disclosure; there is provided a switch device including: a first switch device; a second switch device; a third switch device, wherein each of the first to third switch devices is the switch device described above; a sixth transmission line connecting a first output point of the first switch device to an input point of the second switch device; and a seventh transmission line connecting a second output point of the first switch device to an input point of the third switch device.

Each of the sixth transmission line and the seventh transmission line may cause the 90-degree phase shift when the signal of the operating frequency is delivered therethrough.

Advantageous Effects of Disclosure

According to an embodiment of the present disclosure, a single-pole multi-throw switch device having a simple and efficient structure is provided.

MODE OF DISCLOSURE

Figure 1:
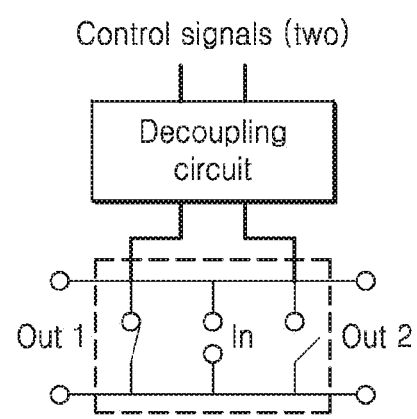
FIG. 1 is a block diagram of a conventional single-pole double-throw commutator.

To make clear the technical idea of the present disclosure, embodiments of the present disclosure will be described in detail with reference to the accompanying drawings. In the following description, well-known functions or constructions are not described in detail so as not to obscure the present disclosure with unnecessary detail. Components having substantially the same functions in the drawings have the same reference numerals and symbols as often as possible even though they are shown in different drawings. Hereinafter, a switch and a commutator are mixedly used.

FIG. 1 is a block diagram of a conventional single-pole double-throw commutator in which two p-type intrinsic n-type (PIN) diodes are used as switch elements. Because such a single-pole double-throw commutator should always have one switch element opened and the other switch element closed, two different control signals, one for each switch element, are used. To remove interference between an RF circuit and a control circuit in this switch device, a specific decoupling circuit should be used.

Triangle Loop Commutator

In the present disclosure, using one control signal instead of using a conventional approach of controlling a single-pole multi-throw commutator based on a plurality of signals is proposed. A first embodiment of the present disclosure is a single-pole double-throw (SPDT) commutator shown in FIG. 2A.

Figure 2A:
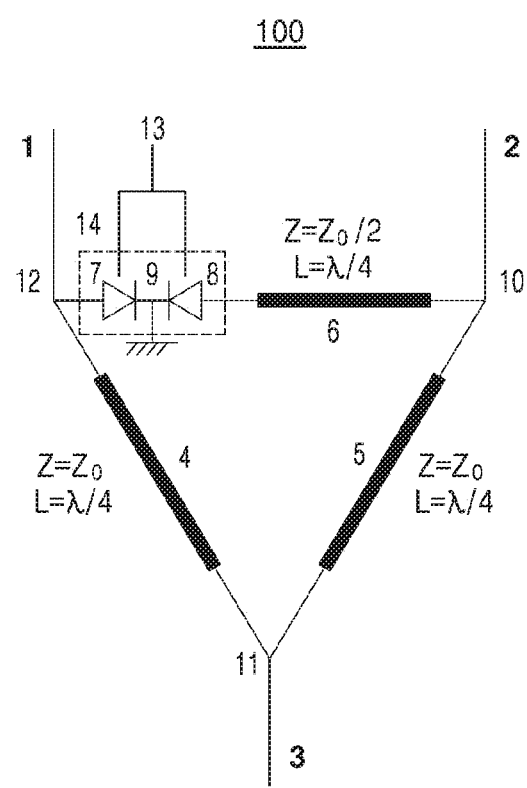
FIG. 2A is a circuit diagram of a single-pole double-throw commutator according to an embodiment of the present disclosure.

FIG. 2A is a circuit diagram of an SPDT commutator 100 having two output ports, e.g., first and second output ports 1 and 2 and one input port 3, according to an embodiment of the present disclosure. A first commutator branch located between the input port 3 and the first output port 1 and a second commutator branch located between the input port 3 and the second output port 2 respectively include first and second transmission line segments 4 and 5 each having an impedance of $Z=Z_0$ and a length of $L=\lambda/4$. A third commutator branch is located between the first output port 1 and the second output port 2 and includes a third transmission line segment 6 having an impedance of $Z=Z_0/2$ and a length of $L=\lambda/4$. A switch unit 14 is connected to one end of the third transmission line segment 6. The switch unit 14 may include two switch elements, e.g., first and second switch elements 7 and 8 connected to each other and having always the same state, i.e., turned on or off together. Therefore, only one control signal 13 is necessary to control the first and second switch elements 7 and 8. A ground point 9 connected to the ground may be located between the switch elements 7 and 8. An input point 11 connect the first branch, the second branch, and the input port 3 to each other. A first output point 12 connects the first branch, the third branch, and the first output port 1 to each other. A second output point 10 connects the second branch, the third branch, and the second output port 2 to each other.

Figure 2B:
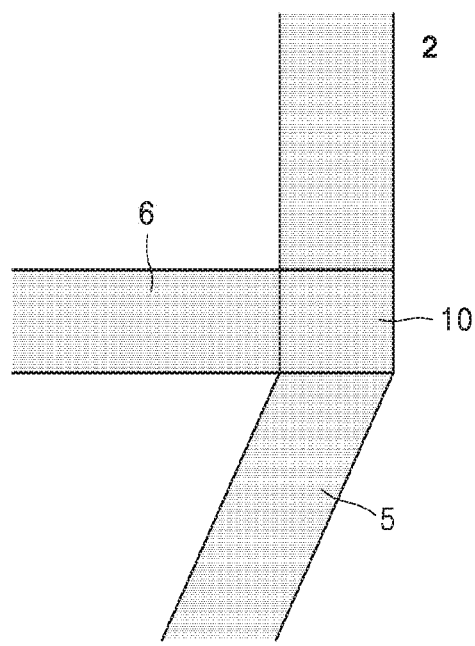
FIG. 2B is a magnified view of a part of a second output point of FIG. 2A.

Herein, the term "point" may indicate a conductor of a size which may be substantially dealt with as one dot on a circuit because an object physically corresponding to one dot cannot exist. The term "point" may indicate a conductor in a range having substantially the same potential when a signal at an operating frequency of the SPDT commutator 100 passes therethrough. The term "point" may indicate a conductor of a size much less than a wavelength of a signal of the operating frequency, i.e., an operating wavelength. For example, as shown in FIG. 2B, the second output point 10 may be a conductor at a cross point of the second transmission line segment 5, the third transmission line segment 6, and the second output port 2.

Figure 3A:
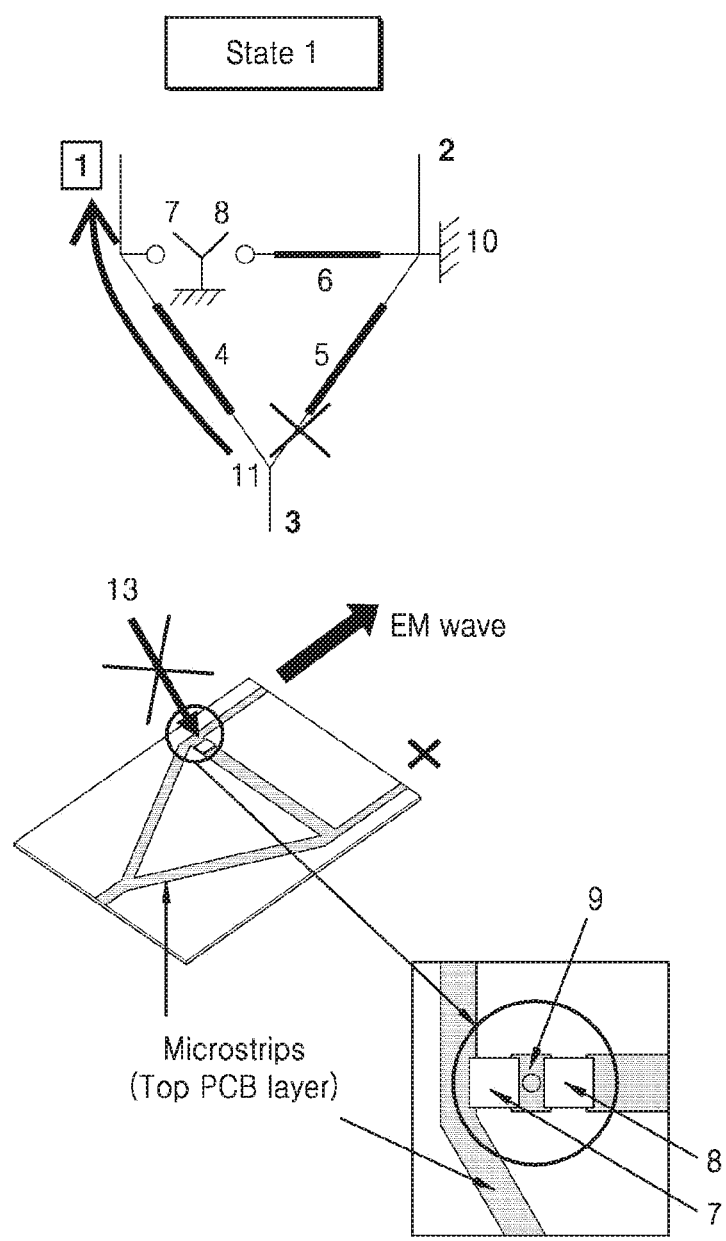
FIGS. 3A and 3B illustrate an operating principle of a single-pole double-throw commutator according to an embodiment of the present disclosure.
Figure 3B:
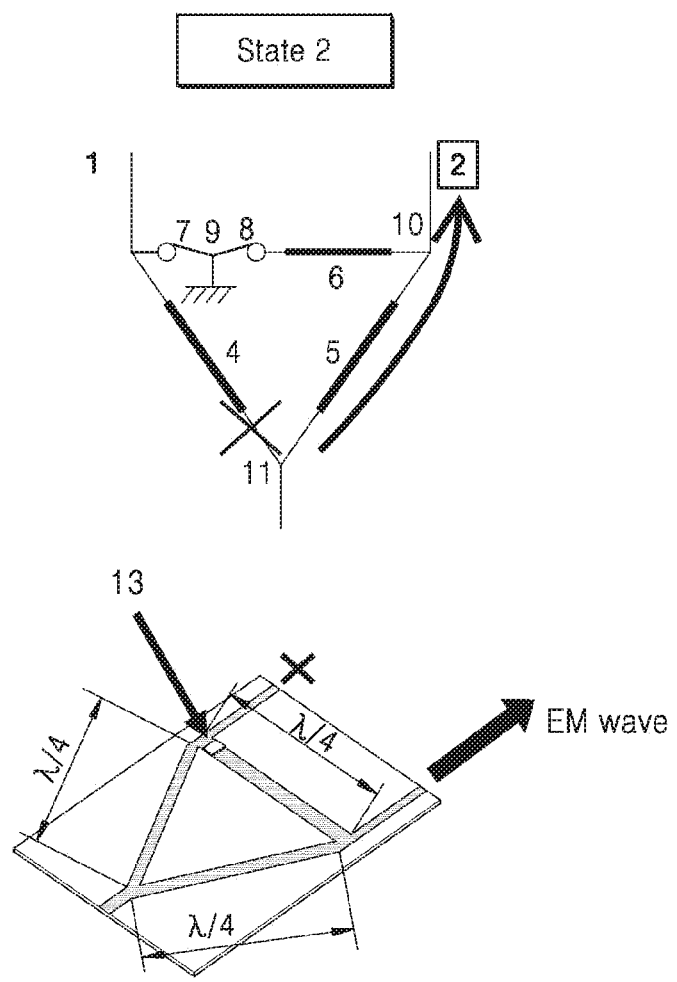

FIGS. 3A and 3B illustrate an operating principle of the SPAT commutator 100 according to an embodiment of the present disclosure.

Referring to FIG. 3A, in a state 1, the control signal 13 makes the switch elements 7 and 8 be in an OFF state. First, the third branch is described. As known through a transmission line theory, when one end of a 114-wave transmission line segment is open or has a load of an infinite resistance R=∞ (in FIG. 3A, one end of the third transmission line segment 6 connected to the second switch element 8 turned off), the other end thereof (in FIG. 3A, the other end of the third transmission line segment 6 connected to the second output point 10) has a zero impedance, i.e., a short-circuit mode, or R=0. In other words, a "virtual ground" is formed on the second output point 10.

Therefore, half energy of an electromagnetic (EM) wave reaching the input port 3 passes from the input point 11 through the first transmission line segment 4, and then is delivered to a load by fully passing through a line because there is no discontinuity on the line (because the first switch element 7 is turned off), That is, the half energy of the EM wave is delivered to the first output port 1. The other half of the EM wave flux passes from the input point 11 through the second transmission line segment 5, returns to the input point 11 by being reflected from the second output point 10 having a zero impedance of the "virtual ground", and is delivered to the first output port 1 by being coupled to a first port of the EM wave in the same phase.

Referring to FIG. 3B, in a state 2, the control signal 13 makes the switch elements 7 and 8 be in an ON state. Again, the third branch is first described. when one end of a ¼-wave transmission line segment is short-circuited (R=0) (in FIG. 3B, the ground point 9 at which the one end of the third transmission line segment 6 is short-circuited to the ground through the second switch element 8 turned on), the other end thereof (in FIG. 3B, the second output point 10) has a very high impedance (Z=∞).

Therefore, a first part of energy of an EM wave reaching the input port 3 passes from the input point 11 through the first transmission line segment 4, returns to the input point 11 by being reflected from the ground point 9 which is short-circuited, is coupled to a second part of the EM flux in the same phase, and is delivered to a load (the second output port 2) by fully passing through a line because there is no discontinuity on the line (because the one end of the third transmission line segment 6 connected to the second output point 10 has an impedance Z=∞).

Therefore, in the state 1, the whole energy is delivered to the first output port, and in the state 2, the whole energy is delivered to the second output port 2.

Figure 4A:
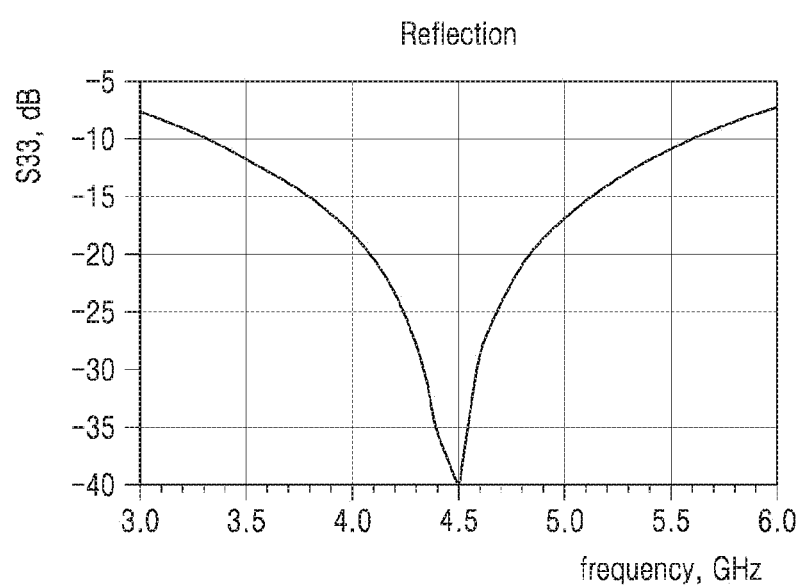
FIGS. 4A to 4D are graphs showing a simulation result of a single-pole double-throw commutator according to an embodiment of the present disclosure.
Figure 4B:
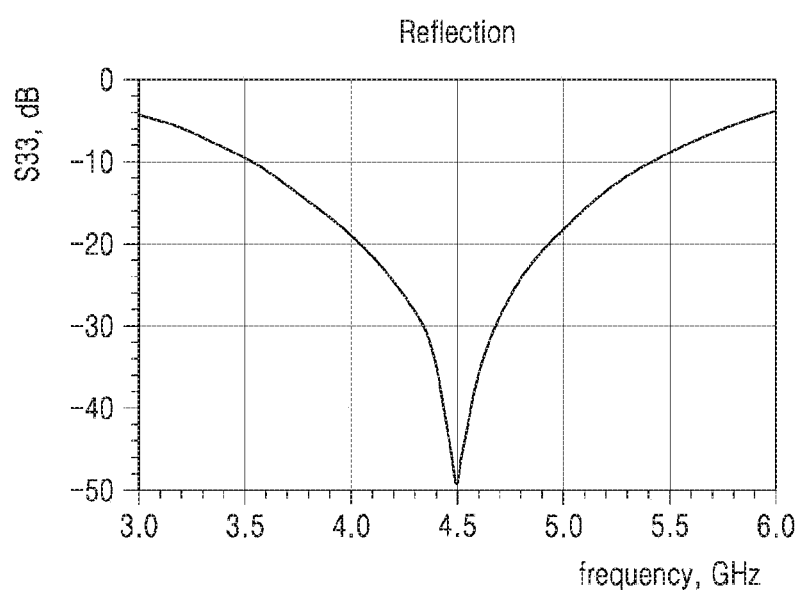
Figure 4C:
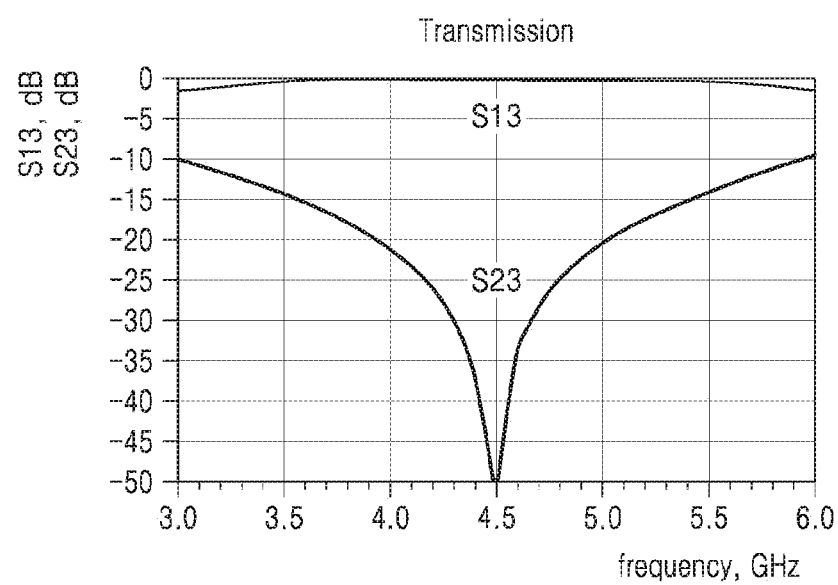
Figure 4D:
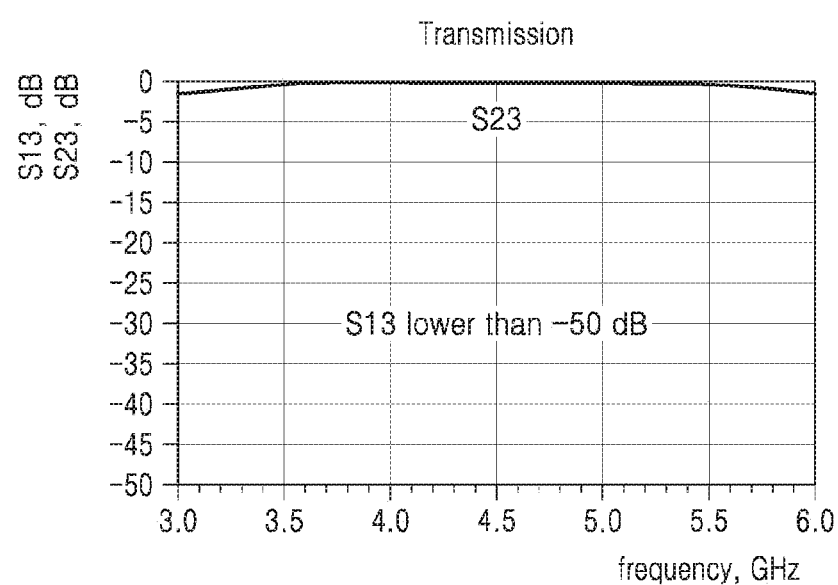

FIGS. 4A to 4D are graphs showing a simulation result of an S parameter of an SPDT commutator described above at a (22% broadband) frequency of 4.5 G Hz±0.5 GHz. FIGS. 4A and 4B show graphs of a reflection coefficient S33 of a wave to the input port 3 in the states 1 and 2, respectively, and FIGS. 4C and 4D show graphs of a transmission coefficient S13 of a wave from an input to the first output port 1 and a transmission coefficient S23 of a wave from the input to the second output port 2 in the states 1 and 2, respectively. In FIG. 4D, only a replaced label is displayed instead of a graph of S13 in the state 2 because the graph of S13 is not shown on the entire image of which a lower limit is −50 dB. As shown in the graphs, in the state 1, the entire signal is delivered to the first output port 1 (S13–>0 dB), whereas no signal is delivered to the ports 2 and 3 (S23<−50 dB, S33<−40 dB). Likewise, in the state 2, the entire signal is delivered to the second output port 2 (S23–>0 dB), whereas no signal is delivered to the ports 1 and 3 (S13<−50 dB, S33<−50 dB).

As described above, although the SPDT commutator 100 has the two switch elements 7 and 8, the SPDT commutator 100 is controlled by only one control signal 13. Therefore, to separate the control signal from a radio frequency (RF) signal, only one separation circuit is necessary. Such a commutator has a small loss even at a high frequency and is not influenced from interference from an external component. By minimizing the number of components, a function capable of saving costs and being integrated with a miniaturized device is provided. As a result, compared to a conventional solution of a millimeter range, a more simplified configuration of an SPDT commutator may be provided, and higher performance in terms of loss and available operating frequency may be guaranteed.

Various embodiments of the proposed SPDT commutator may be provided. For example, an arbitrary available element including a PIN diode, an MEMS element, an optical switch element, and the like may be used as the switch element schematically shown in FIG. 2. Although a microstrip conductor is indicated as a transmission line segment because the microstrip conductor is convenient to be integrated with a printed circuit board (PCB) solution, another type of transmission line known to those of ordinary skill in the art may be used in accordance with circumstances.

Figure 5A:
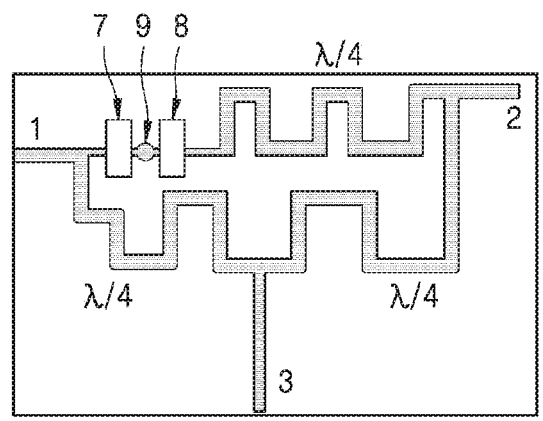
FIGS. 5A and 5B are examples of shapes of a transmission line segment of a single-pole double-throw commutator according to an embodiment of the present disclosure.
Figure 5B:
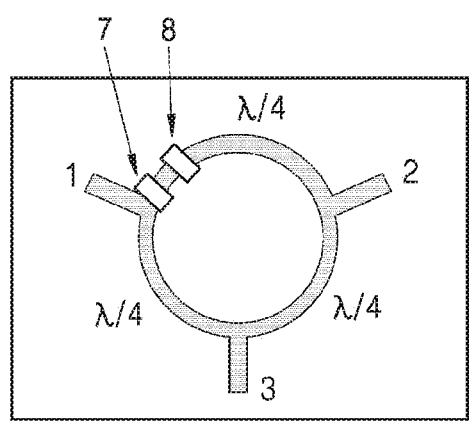

The transmission line segments 4, 5, and 6 may be produced in an appropriate shape such as a straight line (FIGS. 3A and 3B), a circle (FIG. 5B), or an irregular shape (FIG. 5A). An unchangeable condition is that a length of each segment is $\lambda/4$, i.e., ¼ wavelength. Although it has been described that a segment length is $\lambda/4$, a similar effect may be obtained even in a case where the segment length is $3\lambda/4$, and this case belongs to the same scope as the case where the segment length is $\lambda/4$. Likewise, a similar effect may be obtained even in a case where the segment length is $(n/2+¼)\lambda$, and this case also belongs to the same scope as the case where the segment length is $\lambda/4$. However, when the segment length is greater than $\lambda/4$, a size of a commutator may be large, and an operating bandwidth may be narrowed.

Commutator Using One Switch Element

Figure 6:
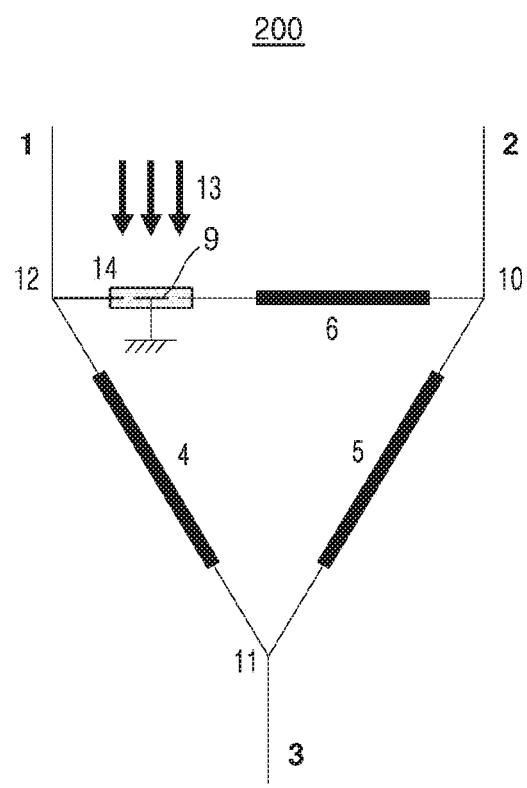
FIG. 6 is a circuit diagram of a single-pole double-throw commutator using an optical switch element, according to an embodiment of the present disclosure.

According to an embodiment of the present disclosure, it is proposed to additionally simplify the commutator structure described above. To this end, in a commutator 200, only one optical switch element 14 is used as one pair of the switch elements 7 and 8, and the optical switch element 14 may be based on a photoconductive element (PE) covering the entire region between the first output point 12 and the one end of the third transmission line segment 6 (see FIG. 6). A dielectric gap may exist between the ground point 9 at which the optical switch element 14 is connected to the ground and points at which the optical switch element 14 is connected to the first and third transmission line segments 4 and 6.

The PE may have at least two states, i.e., a dielectric state (switch OFF state) in which electrical conductivity is low when there is no control flux and a conductor state (switch ON state) in which electrical conductivity is relatively high when there is control flux.

When light 13 is not applied to the optical switch element 14, the PE is in the dielectric state (OFF) that is equivalent to the state 1 of the SPAT commutator 100 when the switch elements 7 and 8 are turned off. That is, an EM wave reaching the commutator 200 through the input port 3 is delivered to the first output port 1 almost without loss.

When the light 13 is applied to the optical switch element 14, the PE is in the conductor state (ON), and accordingly, the one end of the third transmission line segment 6 and the first output point 12 are short-circuited to the ground point 9, and this state is the same as the state 2 of the SPDT commutator 100 when the switch elements 7 and 8 are turned on. As a result, an EM wave reaching the commutator 200 through the input port 3 is delivered to the second output port 2 almost without loss.

Figure 7A:
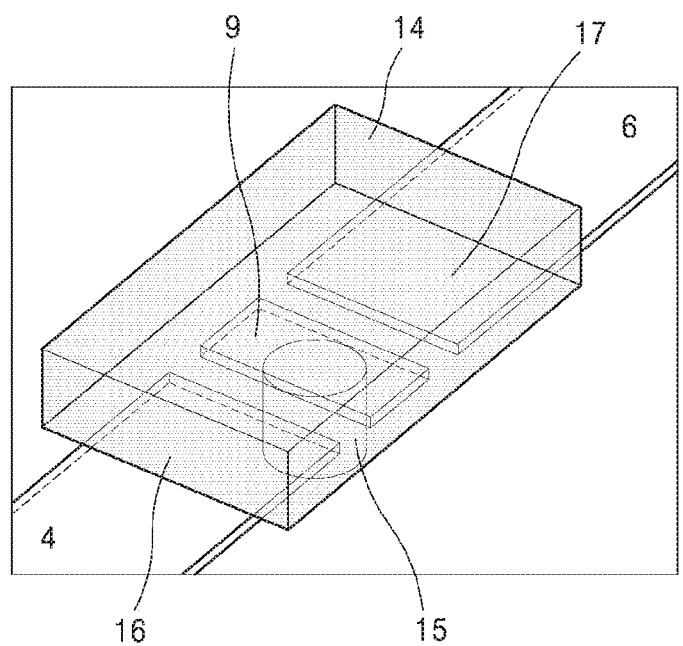
FIGS. 7A and 7B are magnified views of an optical switch element part of the single-pole double-throw commutator of FIG. 6.
Figure 7B:
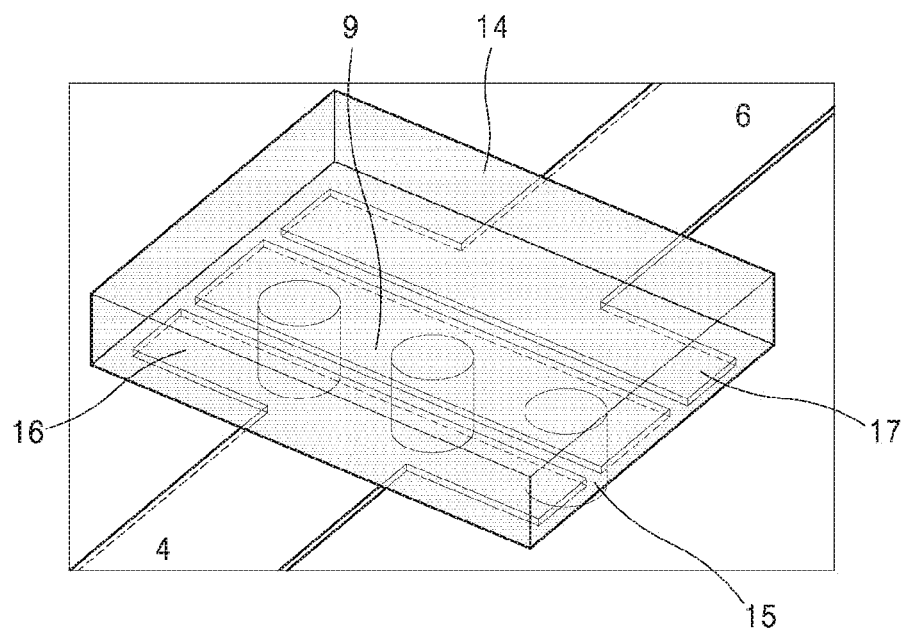

According to an embodiment of the present disclosure, the commutator 200 may be produced based on a microstrip line (MSL) using a PCB technique (FIGS. 7A and 7B). When considering that impedances of the first and second branches are Z=Z0 and an impedance of the third branch is Z0/2, a width of a microstrip may be selected under a condition of Z1=Z2=2Z3. A length of each transmission line segment is a ¼ wavelength (λ/4). The ground point 9 is located at a dielectric gap between one ends of microstrips 4 and 6, and the ground point 9 may be a contact pad to be connected to a ground surface of a PCB. A connection of the contact pad 9 to the ground may be performed using one (FIG. 7A) or more (FIG. 7B) metal vias 15. All of a contact pad 16 at the one end of the microstrip 4, a contact pad 17 at the one end of the microstrip 6, and the contact pad 9 may be fully covered by the PE. A gap between contact pads may be formed to be as small as possible in order to reduce a short-circuit resistance. By increasing a width of a contact pad, i.e., a side surface size and the number of vias, a short-circuit area may be increased, and a resistance may be decreased, thereby enabling characteristics of the commutator 200 to be improved.

Figure 8A:
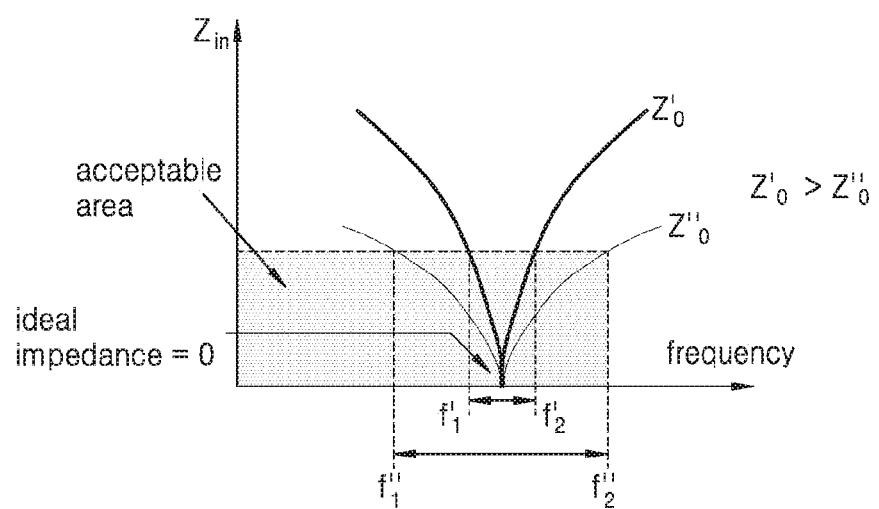
FIGS. 8A and 8B are graphs showing frequency dependence of an input impedance of a third branch in a single-pole double-throw commutator according to an embodiment of the present disclosure.
Figure 8B:
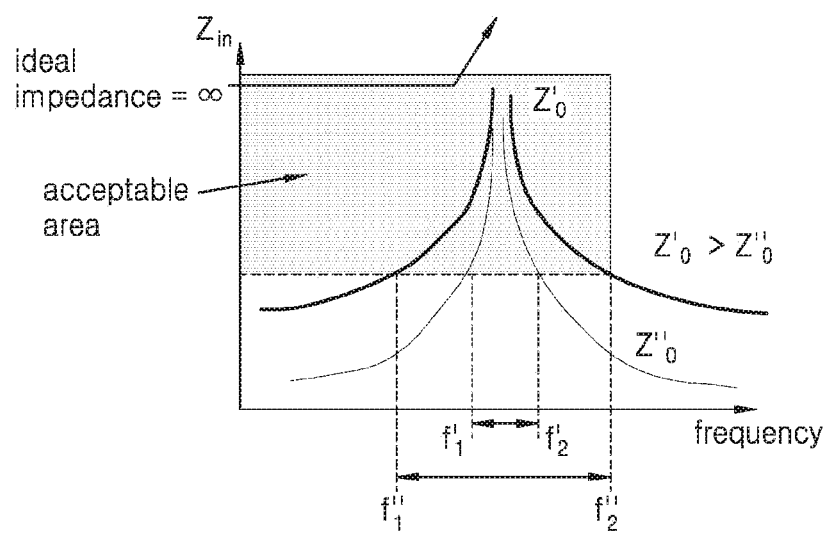

Next, FIGS. 8A and 8B are graphs showing frequency dependence of an impedance of a third branch to describe a proposal reason why an impedance of the third branch is set to be the same as half an impedance of each of first and second branches.

FIG. 8A shows a graph of the state 1 in which switch element(s) is (are) open. In this case, the input impedance of the third branch is as follows.

$$Z_{in}=Z_0 ctg(\beta L),$$

where $Z_0$ denotes a self-impedance of the third branch, L=λ/4 denotes a length of the second branch, and β=2π/λ denotes a propagation constant.

$\beta L=\pi/2$, $ctg(\lambda 2)=0$, and $Z_{in}=0$ for open switch element(s). However, this condition is true only at a central operating frequency. Actually, a signal of a specific frequency band needs to pass through a commutator in many application fields. That is, a value of βL varies within $\beta L=\pi/2\pm\Delta$, and the impedance $Z_{in}$ varies. The larger the impedance $Z_0$, the quicker an impedance change. This pattern may appear in FIG. 8A, where a graph of $Z_0'$ is less smooth than a graph of $Z_0''$ ($Z_0'>Z_0''$). The more a graph is smooth, i.e., the less an impedance, the wider an operating frequency band. In other words, a blocking frequency difference for $Z_0''$ is greater than that for $Z_0'$. That is, $f_2''-f_1''>f_2'-f_1'$.

On the contrary, in the state 2 (FIG. 8B) in which the switch element(s) is (are) closed, the input impedance of the third branch is as follows.

$$Z_{in}=Z_0 tg(\beta L),$$

Therefore, $\beta L=\pi/2$, $tg(\pi/2)=\infty$, and $Z_{in}=\infty$ at the central operating frequency for the closed switch element(s). When a value of βL varies within $\beta L=\pi/2\pm\Delta$, the less the impedance $Z_0$, the quicker a change in the impedance $Z_{in}$. In That is, the larger the impedance $Z_0$, the wider the operating frequency band.

As described above, the above two cases are opposite to each other, and thus, an optimal impedance value of the third branch is $Z=Z_0/2$ as a compromise therebetween, and in this case, a bandwidth of a first output channel is the same as that of a second output channel.

Figure 9A:
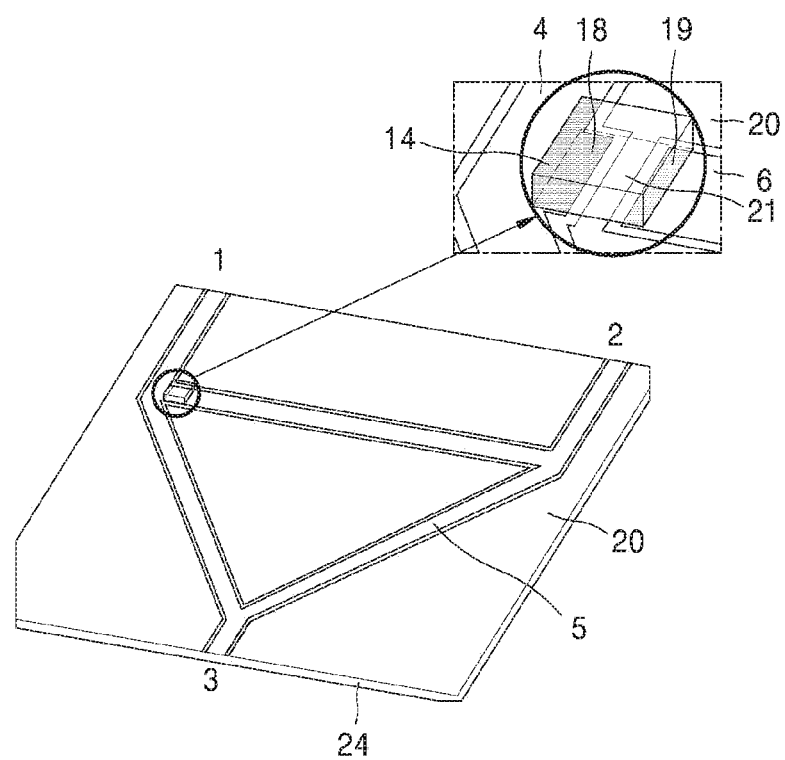
FIG. 9A is a perspective view of a single-pole double-throw commutator based on a coplanar waveguide, according to an embodiment of the present disclosure.
Figure 9B:
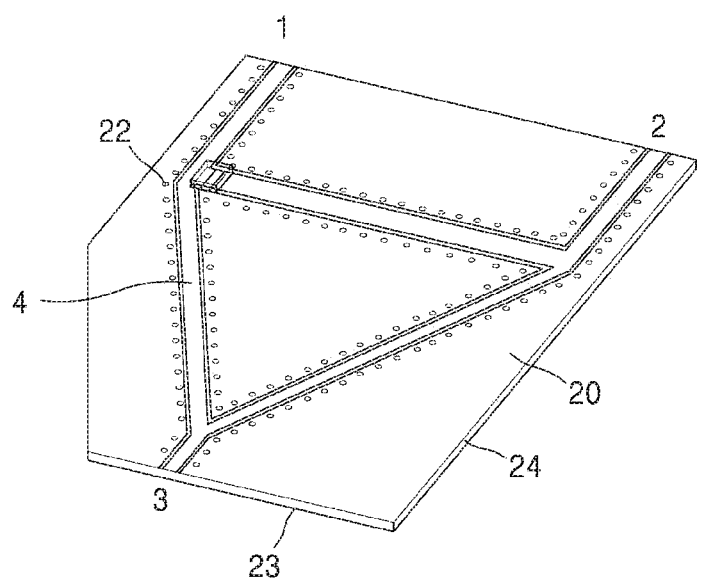
FIG. 9B is a perspective view of a single-pole double-throw commutator based on a grounded coplanar waveguide, according to an embodiment of the present disclosure.

According to an embodiment of the present disclosure, the commutator 200 may be produced based on a coplanar waveguide (CPW) using a PCB technique (FIGS. 9A and 9B). As shown in FIG. 9A, all transmission line segments may be produced as CPW feeder lines. In this case, a coplanar ground surface 20 is located on the same plane as feeder lines on a dielectric substrate 24, and thus, there are no vias. The PE 14 covers contact regions 18 and 19 of one ends of feeder lines and makes, in the switch ON state, the contact regions 18 and 19 be short-circuited to the coplanar ground surface 20 located in a gap 21. By doing this, a commutator may be implemented in a single layer of a PCB. This simplifies a manufacturing technique and reduces a size of a commutator. However, in this case, a phase difference between channels may exist due to different current diffusions in different branches. An embodiment shown in FIG. 9B is based on a grounded coplanar waveguide (GCPW), wherein shielding vias 22 are produced along feeder lines and around the feeder lines, and the shielding vias 22 may connect the coplanar ground surface 20 to a lower ground surface 23 through the dielectric substrate 24. Therefore, a parasitic leakage wave and a path loss may be avoided.

As a material of a PE, various types of semiconductors such as silicon and indium gallium arsenide (InGaAs) may be selected. An electron lifespan T of a material defines a switching time of an optical switch element ($t_{on}$ and $t_{off}$~τ). The electron lifespan T may be reduced by a specific treatment of a photoconductive material, such as electron impact or ion implantation. Nonetheless, a carrier lifespan is inverse proportional to optical power. That is, $P_{opt}$~1/τ As a result, to reduce a switching time, more optical power is necessary, and energy consumption increases. An inverse problem of reducing power consumption of an optical key may be solved by increasing a carrier lifespan. This solution may be achieved by passivating the surface of a PE material, i.e., applying specific coating (e.g., aluminum oxide ($Al_2O_3$) or silicon oxide ($SiO_2$) to the surface, to make surface defects of a PE flat.

As a light source, for example, a light-emitting diode (LED) or a laser diode may be used. In another available implementation for supplying light to a PE, transfer of light through an optical fiber or another embodiment understood by those of ordinary skill in the art may be used. For PE lighting, various light supply mode such as a continuous mode and a pulse mode may be used. Because less optical power is consumed in a pulse-type light supply mode, energy saving in the pulse-type light supply mode is possible when compared to the continuous mode. In this case, a duration of a first pulse should be sufficient to set a switching element to the ON state, a pulse period should be less than a carrier lifespan in a PE material for a period of time when the switching element should maintain the ON state thereafter such that a carrier concentration is not significantly reduced when a light source is turned off, and a pulse duration should be sufficient to fully restore the ON state.

Sizes, shapes, and positions of a PE, a light source, and a via on a PCB and an optical switch element may vary. They may be determined by a current flow area and a PCB structure for efficient switching, the easiness of element arrangement for mounting, and insulation requirements. A light source may be located on the center of a PE or moved to an edge thereof. According to a purpose of a target device, optical power consumption and ON/OFF time of a switching element may be optimized by selecting geometric parameters of a PE and a light source. When sizes of a PE and a light source are determined, compromise points among a size of a device, optical power consumed by a switch element, an ON/OFF time, and selection of a PE having a corresponding carrier lifespan and diffusion length should be found. The sizes of the PE and the light source determine a conductive region provided by an element together with an illuminated region. Requirements for minimizing a dielectric length and a short-circuit resistance of a transmission line segment should also be considered.

Therefore, the commutator 200 includes only one switch element (the optical switch element 14) and only one control signal (the light 13), and does not need a decoupling circuit because a control circuit is separated from an RF port of the commutator 200. Such a commutator has a small loss even at a high frequency and is not influenced from interference from an external component. In addition, such a commutator may be easily mounted on a desired position of a PCB including a multi-layer PCB. In addition, the number of components is minimized to guarantee the possibility of cost saving and integration with a miniaturized device. As a result, compared to a conventional solution of a millimeter range, an SPDT commutator may be more simply designed, and higher performance in terms of loss and available operating frequency may be guaranteed.

Commutator Using a Lumped Element

Figure 10:
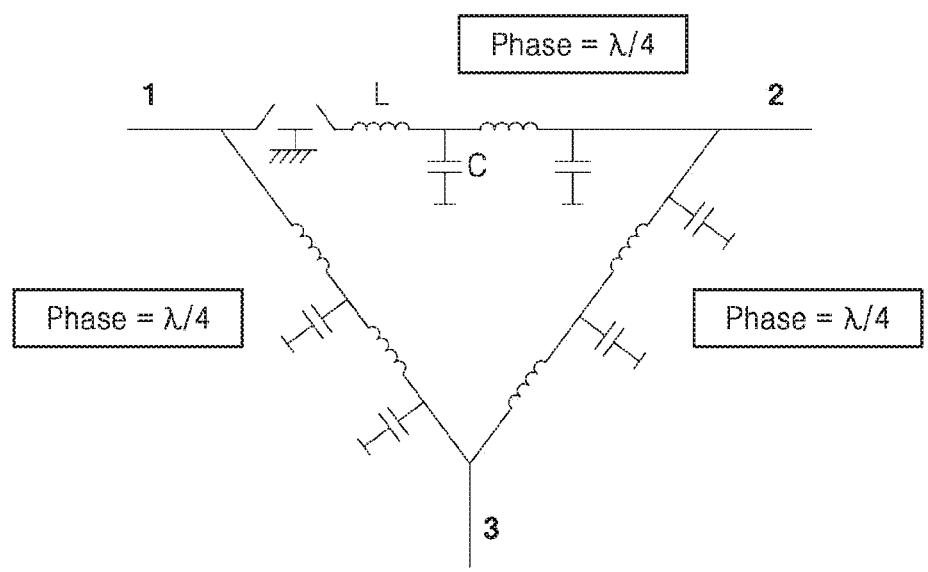
FIG. 10 is a circuit diagram of a single-pole double-throw commutator based on a lumped element, according to an embodiment of the present disclosure.

FIG. 10 is a circuit diagram of an SPDT commutator based on a lumped element, according to an embodiment of the present disclosure. Herein, a transmission line segment may include lumped elements L (inductance) and C (capacitance) connected to the ground. A role of a lumped element group included in a single transmission line segment is providing a $\lambda/4$, i.e., 90-degree phase shift. According to this scheme, not only a size of a commutator is reduced and the commutator is integrated with a chip, but also a use area in a low frequency domain in which the use of a $\lambda/4$ line is impossible or difficult due to a size thereof may extend.

Single-Pole Multi-Throw Commutator

Figure 11:
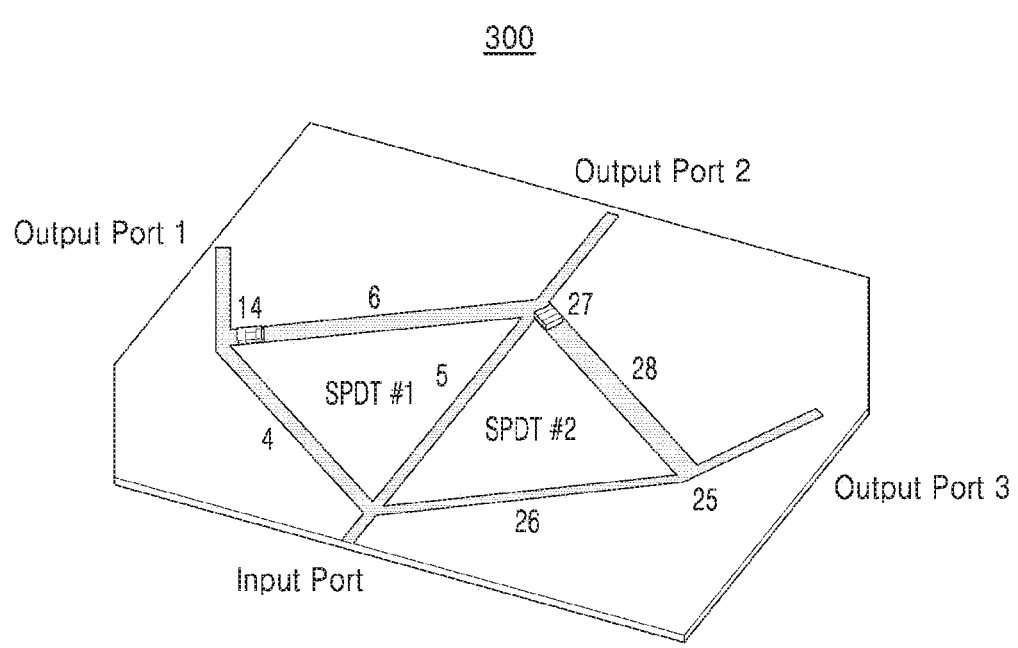
FIG. 11 is a perspective view of a single-pole three-throw commutator according to an embodiment of the present disclosure.

For example, a single-pole multi-throw commutator 300 may be obtained by combining a plurality of SPDT commutators 100 or 200 such that the SPDT commutators 100 or 200 have the same input port, and a second branch of one SPDT commutator is also a first branch of an adjacent SPDT commutator. An example of a single-pole three-throw (SP3T) commutator implemented by the scheme described above is shown in FIG. 11. A control method of the shown SP3T commutator is as shown in Table 1

TABLE 1

| Output port with signal | Switching element 1 | Switching element 2 |
|---|---|---|
| 1 | OFF | OFF |
| 2 | ON | OFF |
| 3 | ON | ON |

As shown in Table 1, the number of control signals in this approach is less by 1 than the number of channels, and in the case of Table 1, two control signals are needed for three channels. When an optical switch element is used, the number of switch elements is also reduced by 1. In addition, this scheme is still very simple, and a decoupling circuit is not necessary.

Figure 12A:
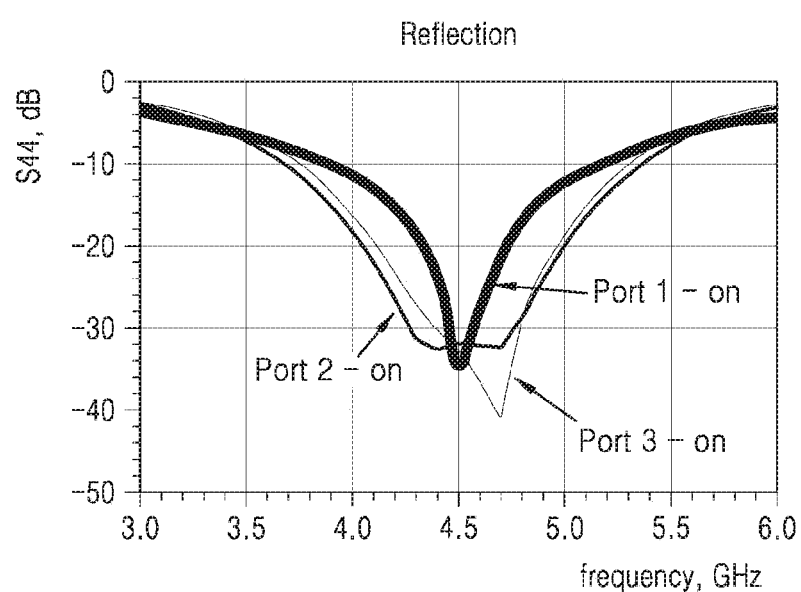
FIGS. 12A and 12B are graphs showing simulation results of a single-pole three-throw commutator according to an embodiment of the present disclosure.
Figure 12B:
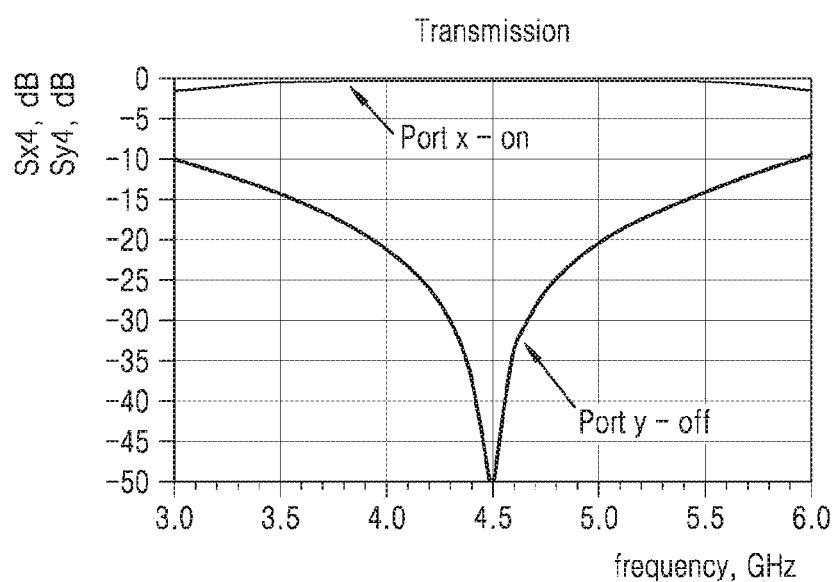

FIGS. 12A and 12B are graphs showing simulation results of a SP3T commutator at a frequency of 4.5 GHz±0.5 GHz. That is, FIG. 12A shows a graph of a reflection coefficient S44 of a wave returning to an input port when a signal is supplied to each of output ports 1 to 3, and FIG. 12B shows a graph of a transmission coefficient Sx4 from the input port to an active output port x and a transmission coefficient Sy4 from the input port to the other inactive output ports y. As shown in the graphs, the entire signal is delivered to a desired output port x (Sx4>−0.4 dB), whereas neither a signal reflected from the input port nor a signal delivered to another output port exist (Sy4<−50 dB, S44<−30 dB).

Figure 13A:
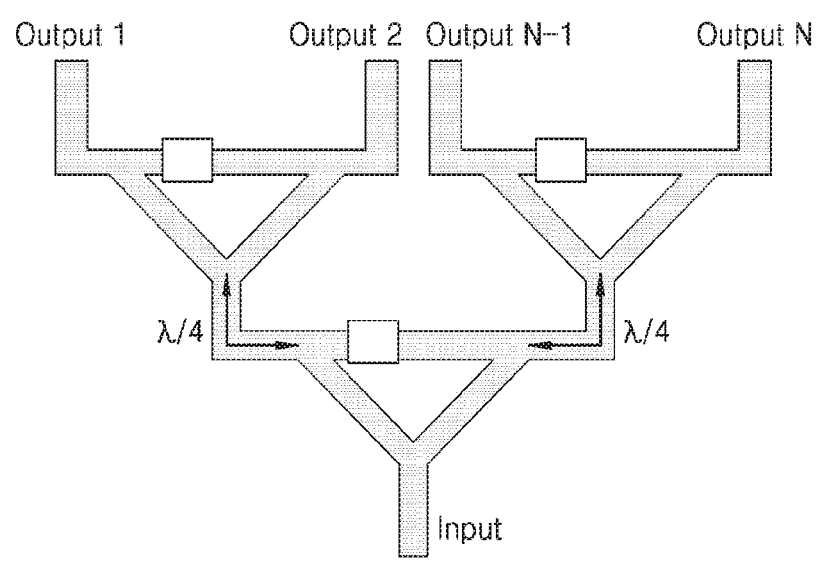
FIG. 13A is a top view of a single-pole multi-throw commutator according to an embodiment of the present disclosure.
Figure 13B:
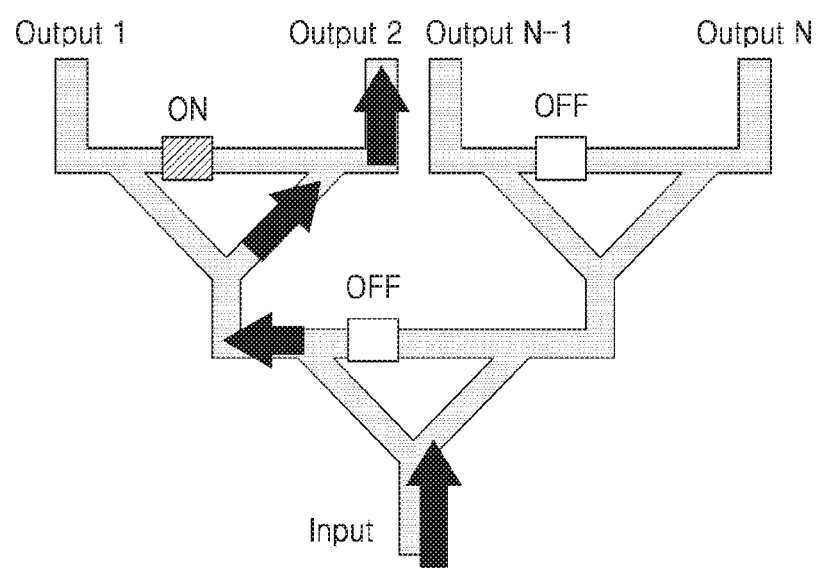
FIG. 13B illustrates an example of an operation of the single-pole multi-throw commutator of FIG. 13A.

Another embodiment of a single-pole multi-throw commutator based on an SPDT commutator is configured by connecting SPDT commutators in series by a binary scheme as shown in FIG. 13A. An output port of an SPDT commutator at a previous stage is also an input port of an SPDT commutator at a subsequent stage. To minimize reflection and deliver a signal to a subsequent SPDT commutator in the same phase, a distance from the output point 10 or 12 of a previous commutator to the input point 11 of a subsequent commutator (a transmission line length between branch points) may be $\lambda/4$. FIG. 13B illustrates an example in which an RF signal is delivered to an output port 2 in the single-pole multi-throw commutator of FIG. 13A. In this case, only one switch element is maintained in the ON state. As in the embodiment described above, such a single-pole n-throw (SPnT) commutator is very simple, does not need a decoupling circuit, and needs a less number of control signals than a conventional solution.

Figure 14A:
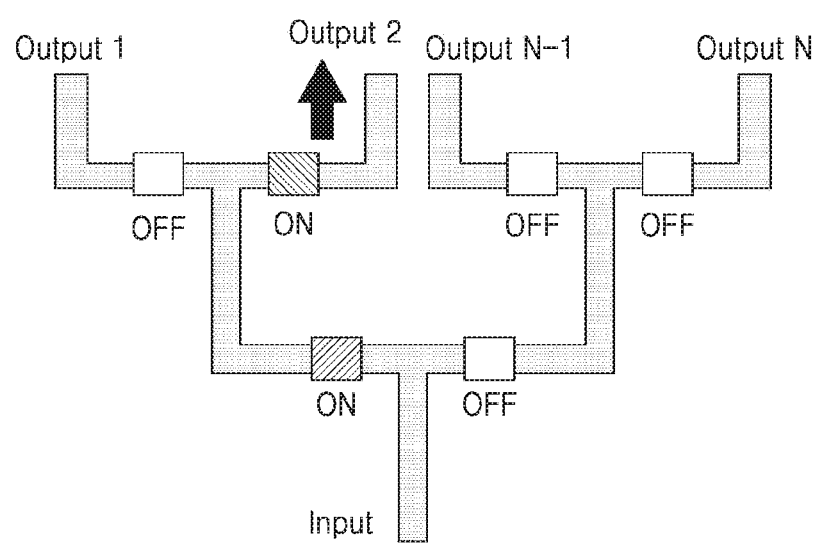
FIG. 14A illustrates an example of an operation of a conventional single-pole multi-throw commutator.
Figure 14B:
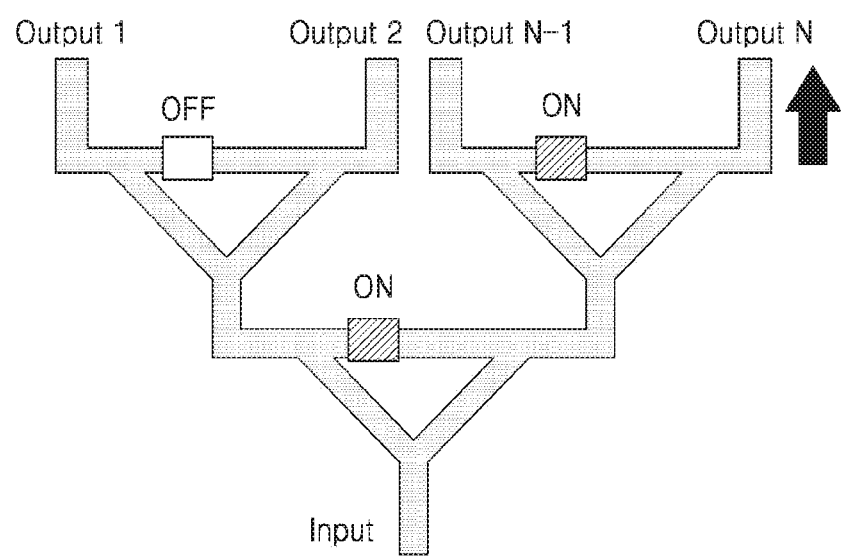
FIG. 14B illustrates an example of an operation of the single-pole multi-throw commutator of FIG. 14A.

Furthermore, in a general case, when the number of SPnT commutator channels is $N=2^n$, unlike a known binary approach in which n switch elements should be maintained in the ON state to supply an RF signal to an arbitrary channel (see FIG. 14A), for a proposed SPnT commutator, n switch elements in the ON state are necessary only in an extreme case in which a signal is applied to a channel N (see FIG. 14B), and no switch elements in the ON state are necessary to supply a signal to a channel 1. For channels 2 to N−1, 1 to (log 2N−1) switch elements in the ON state are necessary (e.g., see FIG. 13B). That is, such a commutator has significantly reduced control power consumption and complexity.

In this embodiment, all of the SPDT commutators 100 and 200 and the single-pole multi-throw commutator 300 may be used. In addition, as a portion of a single-pole multi-throw commutator, a communicator of a design other than proposed in the present disclosure may be used. Therefore, in a general case, this embodiment may be described as follows: a single-pole multi-throw commutator includes a plurality of configuration commutators, the plurality of configuration commutators include at least one SPDT commutator 100 and 200 and/or at least one single-pole multi-throw commutator 300, and each output port of each configuration commutator is an output port of a corresponding single-pole multi-throw commutator or an input port of a subsequent configuration commutator.

According to a first aspect of the present disclosure, an SPDT commutator is provided, the commutator includes an input port, first and second output ports, a first transmission line segment of which ends are connected to the input port and the first output port, a second transmission line segment of which ends are connected to the input port and the second output port, a third transmission line segment of which one end is connected to a point at which the second transmission line segment is connected to the second output port, and two, e.g., first and second switching elements, which are connected to face each other, and of which one ends are connected to each other, a free end of the first switching element is connected to a point at which the first transmission line segment is connected to the first output port, a free end of the second switching element is connected to the other end of the third transmission line segment, the switching elements are connected to the ground at a mutual connection point thereof, the switching elements are configured to be controlled by the same control signal, and each transmission line segment has the same electrical length as a ¼ wavelength of a signal passing through the commutator.

According to an embodiment, an impedance of each of the first and second transmission line segments may be two times an impedance of the third transmission line segment.

According to an embodiment, an electrical length of each switching element from a connection point with the first or third transmission line segment to the ground may be much less than the ¼ wavelength of the signal passing through the commutator.

According to an embodiment, the switching elements may be a PIN diode, an MEMS element, and/or an optical switching element.

According to an embodiment, the transmission line segments may be produced in a straight-line shape, a circular shape, and/or an irregular shape.

According to an embodiment, the transmission line segments may be produced based on a microstrip transmission line, a CPW, a GCPW, and/or lumped inductive and capacitive elements.

According to an embodiment, the two switching elements are designed as a single optical switching element based on a PE covering an entire gap between connection points of the two switching elements with the first and third transmission line segments, wherein a dielectric gap made to separate the connection points from a connection point with the ground may be located below the PE between the connection points of the optical switching element.

According to an embodiment, the connection point of the optical switching element with the ground may be produced as a conductive contact pad connected to the ground by one or more metal vias.

According to an embodiment, the connection points of the optical switching element with the first and third transmission line segments may be produced as conductive contact pads, wherein a width of each conductive contact pad may be greater than a width of each transmission line segment.

According to a second aspect of the present disclosure, a single-pole N-throw (SPNT) commutator is provided, the commutator includes (N−1) adjacent SPDT commutators disclosed in the first aspect, N is a natural number of 3 or more, all the SPDT commutators have the same input port, and for each pair of adjacent SPDT commutators, a first or second transmission line segment of one SPDT commutator may also be a second or first transmission line segment of an adjacent SPDT commutator.

According to a third aspect of the present disclosure, a single-pole multi-throw commutator is provided, the commutator includes an input port, N output ports, and a plurality of configuration commutators, N is a natural number of 3 or more, the plurality of configuration commutators include at least one SPDT commutator described in the first aspect and/or at least one single-pole multi-throw commutator described in the second aspect, and an output port of each configuration commutator may be an output port of a corresponding configuration commutator or an input port of a subsequent configuration commutator.

According to an embodiment, each input port of subsequent configuration commutators may be connected to an output port corresponding to a previous configuration commutator by a transmission line segment having the same electrical length as a ¼ wavelength of a signal passing through the communicator.

The switch device 100, 200, or 300 according to an embodiment of the present disclosure may include the input point 11, the first output point 12, and the second output point 10. The switch device may include the first transmission line segment 4 connecting the input point 11 to the first output point 12 and the second transmission line segment 5 connecting the input point 11 to the second output point 10. That is, the one end of the first transmission line segment 4 may be connected to the input point 11, the other end thereof may be connected to the first output point 12, the one end of the second transmission line segment 5 may be connected to the input point 11, and the other end thereof may be connected to the second output point 10.

The switch device may include the switch unit 14 connected to the first output point 12. The switch unit 14 may be connected to the first output point 12 directly or through an extremely short transmission line, i.e., a much shorter transmission line than an operating wavelength. The switch device may include the third transmission line segment 6 of which the one end is connected to the switch unit 14 and the other end is connected to the second output point 10, That is, the switch unit 14 may have one end connected to the first output point 12 and the other end connected to the third transmission line segment 6.

The third transmission line segment 6 may cause a 90-degree phase shift when a signal at an operating frequency is delivered therethrough. Herein, 90 degrees may include substantial 90 degrees. The third transmission line segment 6 may be produced as a resistive line of which a length is ¼ of the operating wavelength, to cause the 90-degree phase shift. The third transmission line segment 6 may include a reactance unit to cause the 90-degree phase shift. The reactance unit may include an inductor and/or a capacitor that are lumped elements. The lumped element may be implemented by a monolithic microwave integrated circuit (MMIC).

The switch unit 14 may be controlled to be in the ON or OFF state by one control signal. The switch unit 14 may open, in the OFF state, each of the first output point 12 and the one end of the third transmission line segment 6. The switch unit 14 may open the first output point 12 or the one end of the third transmission line segment 6 directly or at an extremely short distance, i.e., a much shorter distance than the operating wavelength. The switch unit 14 may ground, in the ON state, each of the first output point 12 and the one end of the third transmission line segment 6. The switch unit 14 may ground the first output point 12 or the one end of the third transmission line segment 6 directly or at an extremely short distance, i.e., a much shorter distance than the operating wavelength.

Each of the first transmission line segment 4 and the second transmission line segment 5 may cause a 90-degree phase shift when a signal at the operating frequency is delivered therethrough. An impedance of the first transmission line segment 4 may be the same as an impedance of the second transmission line segment 5. Herein, same may include substantial same. The impedance of the first transmission line segment 4 may be two times an impedance of the third transmission line segment 6. Herein, two times may include substantial two times.

The switch unit 14 may include the ground point 9, the first switch element 7 connecting the first output point 12 to the ground point 9, and the second switch element 8 connecting the ground point 9 to the one end of the third transmission line segment 6. That is, the first switch element 7 may have one end connected to the first output point 12 and the other end connected to the ground point 9, and the second switch element 8 may have one end connected to the ground point 9 and the other end connected to the one end of the third transmission line segment 6. Lengths of the first switch element 7 and the second switch element 8 may be much shorter than a length of the operating wavelength. The ground point 9 may be grounded through the via 15 and may be grounded by being connected to the coplanar ground surface 20. The first switch element 7 and the second switch element 8 may be simultaneously controlled to be in the ON or OFF state by the one control signal 13. Herein, simultaneously may include substantial simultaneously.

The control signal 13 may be an optical signal. The switch unit 14 may include the ground point 9 spaced apart from the first output point 12 and the third transmission line segment 6 and include a PE connecting the first output point 12, the ground point 9, and the one end of the third transmission line segment 6. Therefore, according to the optical signal 1, the first output point 12, the ground point 9, and the one end of the third transmission line segment 6 may be electrically connected to or disconnected from each other. The ground point 9 may be grounded through the via 15 and may be grounded by being connected to the coplanar ground surface 20. A distance between the ground point 9 and the first output point 12 or the third transmission line segment 6 may be much shorter than the length of the operating wavelength.

The third transmission line segment 6 may be a planar transmission line. A width of the ground point 9 may be greater than a width of the third transmission line segment 6, and a width of the one end 17 of the third transmission line segment 6 may extend so as to be the same as the width of the ground point 9. Herein, same may include substantial same. The width of the ground point 9 may be greater than a length thereof, and the ground point 9 may be connected to a plurality of ground vias 15 arranged in a widthwise direction.

The switch device may further include a third output point 25, a fourth transmission line segment 26 connecting the input point 11 to the third output point 25, a second switch unit 27 connected to the second output point 10, and a fifth transmission line segment 28 of which one end is connected to the second switch unit 27 and the other end is connected to the third output point 25. The fifth transmission line segment 28 may cause a 90-degree phase shift when a signal at the operating frequency is delivered therethrough. The second switch unit 27 may be controlled to be in the ON or OFF state by one control signal, open, in the OFF state, each of the second output point 10 and the fifth transmission line segment 28, and ground, in the ON state, each of the second output point 10 and the fifth transmission line segment 28.

An impedance of the fourth transmission line segment 26 may be the same as the impedance of the second transmission line segment 5 and two times an impedance of the fifth transmission line segment 28. The fourth transmission line segment 26 may cause a 90-degree phase shift when a signal at the operating frequency is delivered therethrough.

A single-pole multi-throw switch device according to an embodiment of the present disclosure may include a first switch device, a second switch device, and a third switch device, and each of the first switch device, the second switch device, and the third switch device may be any one of the switch devices described above, e.g., the switch device 100, the switch device 200, or the switch device 300. The switch device may include a sixth transmission line segment connecting a first output point of the first switch device to an input point of the second switch device and a seventh transmission line segment connecting a second output point of the first switch device to an input point of the third switch device. Each of the sixth and seventh transmission line segments may cause a 90-degree phase shift when a signal at the operating frequency is delivered therethrough.

The present disclosure has been particularly shown and described with reference to exemplary embodiments shown in the drawings. The embodiments are not desired to limit the present disclosure but only illustrative and should be considered in descriptive sense only and not for purposes of limitation. It will be understood by those of ordinary skill in the art that the embodiments can be easily changed to other particular forms without changing the technical idea or essential features of the present disclosure. Although specific terms are used in the present specification, the terms are used to describe the concept of the present disclosure but are not used to limit the meaning thereof or the scope of the present disclosure defined in the claims.

The true technical scope of the present disclosure for which protection is sought is defined not by the description described above but by the technical idea of the appended claims, and it should be analyzed that all the changed or modified forms derived from the meaning and the scope of the claims and the equivalent concepts thereof are included in the scope of the present disclosure. It should be understood that the equivalents include not only currently known equivalents but also equivalents to be developed in the future, i.e., all components disclosed to perform the same function regardless of a structure thereof.

The invention claimed is:

1. A switch device comprising:
   an input point;
   a first output point;
   a second output point;
   a first transmission line connecting the input point to the first output point;
   a second transmission line connecting the input point to the second output point;
   a switch unit connected to the first output point; and
   a third transmission line of which one end is connected to the switch unit and the other end is connected to the second output point,
   wherein the third transmission line causes a 90-degree phase shift when a signal at an operating frequency is delivered therethrough,
   the switch unit is controlled to be in an ON or OFF state according to one control signal,
   so as to open each of the first output point and the one end of the third transmission line when in the OFF state, and
   ground each of the first output point and the one end of the third transmission line when in the ON state.

2. The switch device of claim 1, wherein a length of the third transmission line is ¼ of an operating wavelength.

3. The switch device of claim 1, wherein the third transmission line comprises a reactance unit configured to cause the 90-degree phase shift when the signal of the operating frequency is delivered therethrough.

4. The switch device of claim 1, wherein each of the first transmission line and the second transmission line causes the 90-degree phase shift when the signal of the operating frequency is delivered therethrough.

5. The switch device of claim 1, wherein impedances of the first transmission line and the second transmission line are identical to each other and are two times an impedance of the third transmission line.

6. The switch device of claim 1, wherein the switch unit comprises:
   a ground point;
   a first switch element connecting the first output point to the ground point; and a second switch element connecting the ground point to the one end of the third transmission line,
wherein the first switch element and the second switch element are simultaneously controlled to be in the ON or OFF state according to the one control signal.

7. The switch device of claim 1, wherein the one control signal is an optical signal.

8. The switch device of claim 7, wherein the switch unit comprises:
a ground point; and
a photoconductive element connecting the first output point, the ground point, and the one end of the third transmission line.

9. The switch device of claim 8, wherein the third transmission line is a planar transmission line,
a width of the ground point is greater than a width of the third transmission line, and
a width of the one end of the third transmission line extends to be the same as the width of the ground point.

10. The switch device of claim 9, wherein the ground point has a width greater than a length and is connected to a plurality of ground vias arranged in a widthwise direction.

11. The switch device of claim 8, being implemented based on a coplanar waveguide (CPW),
wherein the ground point is connected to a coplanar ground surface.

12. The switch device of claim 8, being implemented based on a grounded coplanar waveguide (GCPW),
wherein the ground point is connected to a coplanar ground surface,
shielding vias are arranged around each of the first transmission line, the second transmission line, and the third transmission line, and
the shielding vias connect the coplanar ground surface to a lower ground surface.

13. The switch device of claim 1, further comprising
a third output point;
a fourth transmission line connecting the input point to the third output point;
a second switch unit connected to the second output point; and
a fifth transmission line of which one end is connected to the second switch unit and the other end is connected to the third output point,
wherein the fifth transmission line causes the 90-degree phase shift when the signal at the operating frequency is delivered therethrough, and
the second switch unit is controlled to be in the ON or OFF state according to one control signal,
opens each of the second output point and the fifth transmission line when in the OFF state, and
grounds each of the second output point and the fifth transmission line when in the ON state.

14. A switch device comprising:
a first switch device;
a second switch device;
a third switch device,
wherein each of the first to third switch devices is the switch device of claim 1;
a sixth transmission line connecting a first output point of the first switch device to an input point of the second switch device; and
a seventh transmission line connecting a second output point of the first switch device to an input point of the third switch device.

15. The switch device of claim 14, wherein each of the sixth transmission line and the seventh transmission line causes the 90-degree phase shift when the signal at the operating frequency is delivered therethrough.

* * * * *